United States Patent
Chen et al.

(10) Patent No.: US 12,484,218 B2
(45) Date of Patent: Nov. 25, 2025

(54) ELECTRICALLY ERASABLE PROGRAMMABLE READ ONLY MEMORY CELL AND FORMING METHOD THEREOF

(71) Applicant: UNITED MICROELECTRONICS CORP., Hsin-Chu (TW)

(72) Inventors: Aaron Chen, Singapore (SG); Chi Ren, Singapore (SG); Chao-Sheng Hsieh, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 81 days.

(21) Appl. No.: 18/629,926

(22) Filed: Apr. 8, 2024

(65) Prior Publication Data
US 2024/0260263 A1 Aug. 1, 2024

Related U.S. Application Data

(62) Division of application No. 17/527,182, filed on Nov. 16, 2021, now abandoned.

(30) Foreign Application Priority Data

Oct. 22, 2021 (CN) .......................... 202111230640.8

(51) Int. Cl.
H10B 41/30 (2023.01)
H10B 41/60 (2023.01)
(52) U.S. Cl.
CPC ............. *H10B 41/30* (2023.02); *H10B 41/60* (2023.02)

(58) Field of Classification Search
CPC .... H10B 41/30; H10B 41/60; H10D 30/0411; H10D 30/683; H10D 30/6892; H10D 64/035
See application file for complete search history.

(56) References Cited

U.S. PATENT DOCUMENTS

| | | | |
|---|---|---|---|
| 9,117,695 B1 | 8/2015 | Pan | |
| 9,245,897 B2 * | 1/2016 | Ma | H10D 30/6892 |
| 9,397,228 B2 | 7/2016 | Wu | |
| 9,666,680 B1 * | 5/2017 | Chang | H10D 1/00 |
| 9,917,165 B2 | 3/2018 | Wu | |
| 10,468,427 B2 | 11/2019 | Cai | |
| 2015/0270273 A1 | 9/2015 | Ma | |
| 2019/0206882 A1 | 7/2019 | MacPeak | |

(Continued)

FOREIGN PATENT DOCUMENTS

CN 104900649 A 9/2015
CN 110137085 A 8/2019

*Primary Examiner* — Allison Bernstein
(74) *Attorney, Agent, or Firm* — Winston Hsu

(57) ABSTRACT

An electrically erasable programmable read only memory (EEPROM) cell includes a first gate, a second gate and an erasing gate. The first gate and the second gate are disposed on a substrate, wherein the first gate includes a first floating gate and a first control gate stacked from bottom to top, and the second gate includes a second floating gate and a second control gate stacked from bottom to top. The erasing gate is sandwiched by the first gate and the second gate, wherein a side part of the first floating gate and a side part of the second floating gate right below the erasing gate both have multiple tips. The present invention also provides a method of forming the electrically erasable programmable read only memory (EEPROM) cell.

9 Claims, 5 Drawing Sheets

(56) References Cited

U.S. PATENT DOCUMENTS

2020/0006362 A1  1/2020  Bo
2021/0217866 A1  7/2021  Wang
2022/0416076 A1  12/2022  Yeom

* cited by examiner

ELECTRICALLY ERASABLE PROGRAMMABLE READ ONLY MEMORY CELL AND FORMING METHOD THEREOF

CROSS REFERENCE TO RELATED APPLICATIONS

This application is a division of U.S. application Ser. No. 17/527,182, filed on Nov. 16, 2021. The content of the application is incorporated herein by reference.

BACKGROUND OF THE INVENTION

1. Field of the Invention

The present invention relates to a memory cell and the forming method thereof, and in particular to an electrically erasable programmable read only memory (EEPROM) cell and the forming method thereof.

2. Description of the Prior Art

Semiconductor memory devices are basically divided into two types: one is a volatile memory device, and the other is a nonvolatile memory device. The volatile memory devices include dynamic random access memory (DRAM) and static random access memory (SRAM). The nonvolatile memory device includes electrically erasable programmable read only memory (EEPROM), ferroelectric random access memory (FeRAM), phase-change random access memory (PRAM), magnetic random access memory (MRAM) and flash memory devices, etc. When the external power supply is cut off, the volatile memory loses all the data stored inside, while the nonvolatile memory can still keep the data stored inside.

SUMMARY OF THE INVENTION

The present invention provides an electronically erasable programmable read only memory cell and its forming method, in which a floating gate with a plurality of tips is formed, and these tips are adjacent to the erasing gate, so that the electronic erasing ability of the memory cell can be improved by promoting FN-tunneling by raising the local electric field.

The invention provides an electrically erasable programmable read only memory (EEPROM) cell, which comprises a first gate, a second gate and an erasing gate. The first gate includes a first floating gate and a first control gate stacked from bottom to top, and the second gate includes a second floating gate and a second control gate stacked from bottom to top. The erasing gate is sandwiched between the first gate and the second gate, wherein one side part of the first floating gate directly under the erasing gate and one side part of the second floating gate directly under the erasing gate have multiple tips.

The invention provides a method for forming an electrically erasable programmable read only memory (EEPROM) cell, which comprises the following steps. At first, a floating gate layer and a control gate are sequentially formed on a substrate. Then, a first spacer is formed on the floating gate layer and on a first side of the control gate. Thereafter, the exposed top of the floating gate layer is removed, thereby forming a pre-floating gate layer, the pre-floating gate layer has a stepped side part. Then, a second spacer is formed on the pre-floating gate layer and the first side of the control gate. Then, the exposed part of the pre-floating gate layer is removed, thereby forming a floating gate, wherein the floating gate has a two-step side part.

In view of the above, the present invention provides an electronically erasable programmable read only memory cell and its forming method, a first gate and a second gate are arranged on a substrate, the first gate comprises a first floating gate and a first control gate stacked from bottom to top, and the second gate comprises a second floating gate and a second control gate stacked from bottom to top. An erasing gate is arranged between the first gate and the second gate, one side part of the first floating gate directly under the erasing gate and one side part of the second floating gate directly under the erasing gate have multiple tips. Therefore, in the present invention, a plurality of tips can be adjacent to the erasing gate to promote tip discharge (FN-tunneling), thereby improving the electronic erase capability of the memory cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
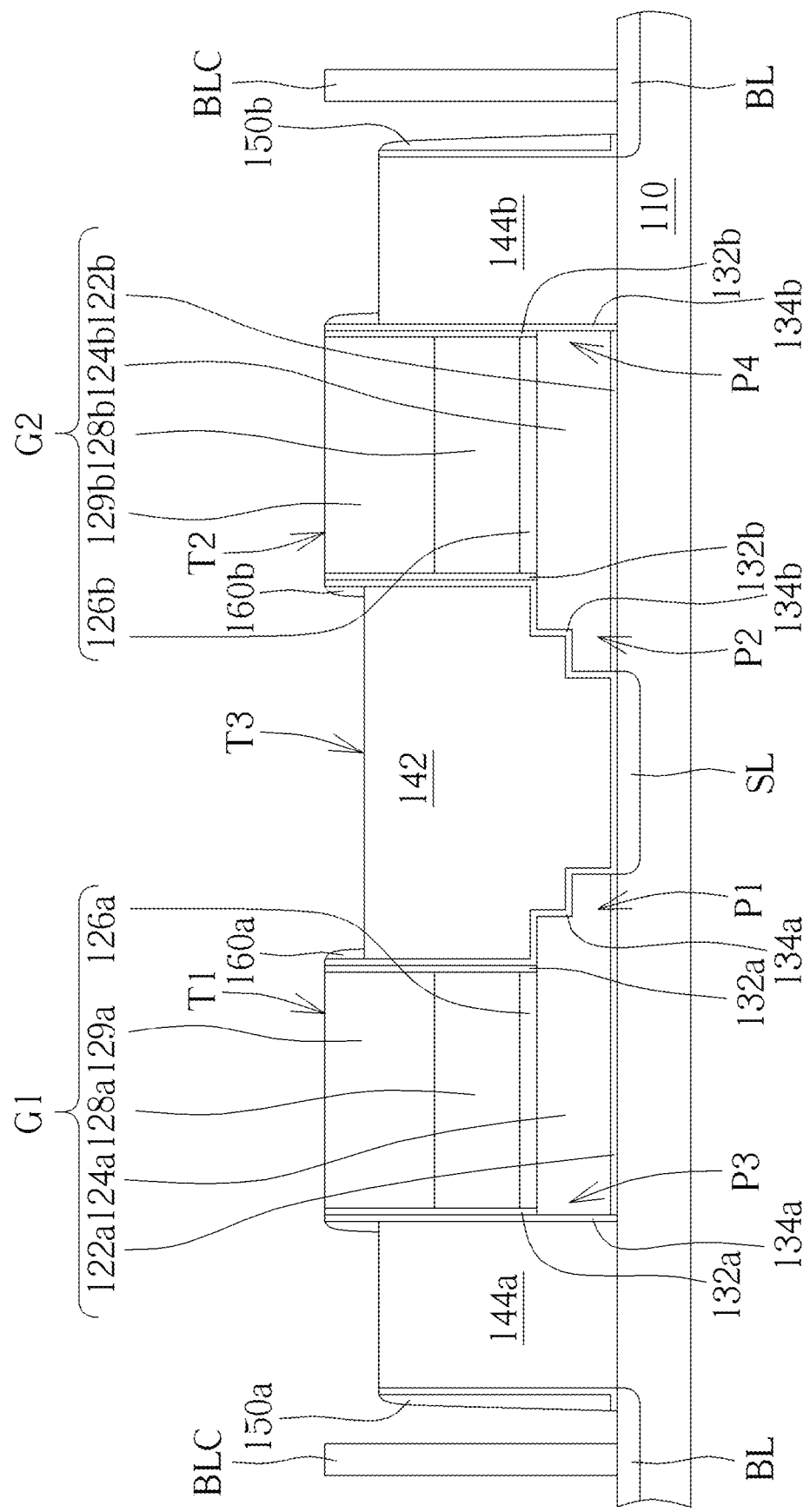
FIG. 1 is a schematic cross-sectional view of an electronically erasable programmable read only memory cell according to a preferred embodiment of the present invention.

FIG. 1 is a schematic cross-sectional view of an electronically erasable programmable read only memory cell according to a preferred embodiment of the present invention. As shown in FIG. 1, a substrate 110 is provided, the substrate 110 is, for example, a silicon substrate, a silicon-containing substrate (e.g., SiC), a group III-V substrate (such as GaN), a group III-V on silicon substrate (such as GaN-on-silicon), a graphene-on-silicon substrate, and a silicon-on-insulator. In the illustration of this embodiment, only the substrate 110 of the electronically erasable programmable read only memory area is shown.

A first gate G1 and a second gate G2 are disposed on the substrate 110. In this embodiment, the first gate G1 includes a dielectric layer 122a, a first floating gate 124a, an ONO layer 126a, a first control gate 128a and a first hard mask 129a stacked from bottom to top, while the second gate G2 includes a dielectric layer 122b, a second floating gate 124b, an ONO layer 126b, a second control gate 128b and a second hard mask 129b stacked from bottom to top. The dielectric layer 122a/122b may be an oxide layer, the first floating gate 124a and the second floating gate 124b may be polysilicon layers, the ONO layers 126a/126b are composed of an oxide layer/a nitride layer/an oxide layer stacked from bottom to top, the first control gate 128a and the second control gate 128b may be polysilicon layers, and the first hard mask 129 and the second hard mask 129b may be, for example, a nitride layer, but the present invention is not limited thereto.

A spacer 132a is located on the first floating gate 124a, and spacer 132a is located beside the first control gate 128a and the first hard mask 129a. A spacer 132b is located on the second floating gate 124b, and the spacer 132b is located beside the second control gate 128b and the second hard mask 129b. In this embodiment, the spacers 132a/132b can be, for example, a double-layer spacer composed of an inner oxide layer and an outer nitride layer, but the present invention is not limited thereto. A first dielectric layer 134a covers the side of the first control gate 128a, the side of the first hard mask 129a and the first floating gate 124a, and a second dielectric layer 134b covers the side of the second control gate 128b, the side of the second hard mask 129b and the second floating gate 124b to isolate the first floating gate 124a/the second floating gate 124b and the upper erasing gate. In the preferred embodiment, the first dielectric layer 134a and the second dielectric layer 134b are joined as a blanket dielectric layer. In this embodiment, the first dielectric layer 134a and the second dielectric layer 134b are oxide layers, but the present invention is not limited thereto.

An erasing gate 142 is sandwiched between the first gate G1 and the second gate G2. The first dielectric layer 134a isolates the erasing gate 142 from the first floating gate 124a, while the second dielectric layer 134b isolates the erasing gate 142 from the second floating gate 124b. According to the present invention, a side part P1 of the first floating gate 124a directly under the erasing gate 142 and a side part P2 of the second floating gate 124b directly under the erasing gate 142 have a plurality of tips. Therefore, the invention can improve the electronic erasing ability of the memory cell by boosting the local electric field to promote the tip discharge. In this embodiment, the side part P1 of the first floating gate 124a has two tips, and the side part P2 of the second floating gate 124b has two tips. That is, the side part P1 of the first floating gate 124a directly under the erasing gate 142 and the side part P2 of the second floating gate 124b directly under the erasing gate 142 are both two-step side parts, each two-step side part includes two steps, but the present invention is not limited thereto.

A first word line 144a is disposed on the side of the first gate G1 opposite to the erasing gate 142, and a second word line 144b is disposed on the side of the second gate G2 opposite to the erasing gate 142. In the preferred embodiment, the erasing gate 142, the first word line 144a and the second word line 144b are all made of the same material, such as polysilicon, and are simultaneously formed by the same process, but the present invention is not limited thereto.

Spacers 150a/150b are disposed on the substrate 110 opposite to the first word line 144a of the erasing gate 142 and opposite to the second word line 144b of the erasing gate 142. Further, the bit lines BL are located in the substrate 110 beside the spacers 150a/150b respectively. The bit line contact plug BLC is disposed right above the bit line BL. A source line SL is located in the substrate 110 directly under the erasing gate 142.

The other side P3 of the first floating gate 124a opposite to the erasing gate 142 and the other side P4 of the second floating gate 124b opposite to the erasing gate 142 have vertical sidewalls, but the present invention is not limited thereto.

In a preferred embodiment, a top surface T1 of the first hard mask 129a and a top surface T2 of the second hard mask 129b are higher than a top surface T3 of the erasing gate 142, so as to avoid shorting issue caused by interconnection between the first word line 144a, the second word line 144b and the erasing gate 142. In a preferred embodiment, two spacers 160a/160b are disposed on the erasing gates 142 on the sides of the first hard mask 129a and on the side of the second hard mask 129b.

Figure 2:
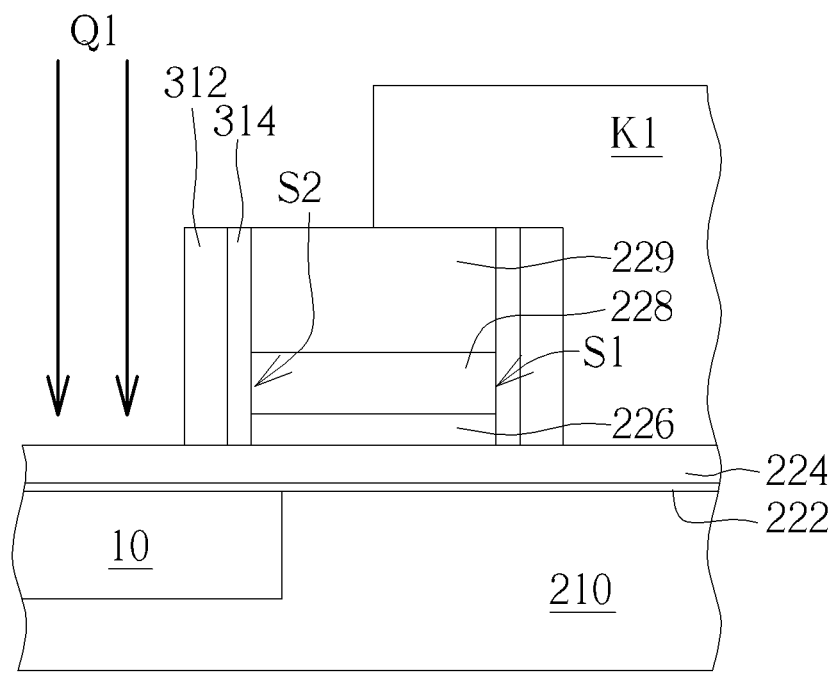
FIG. 2 is a schematic cross-sectional view of a method for forming an electronically erasable programmable read only memory cell in a preferred embodiment of the present invention.

Next, a method for forming an electronically erasable programmable read only memory cell with floating gates with multiple tips is proposed. FIGS. 2-8 show schematic cross-sectional views of a method for forming an electronically erasable programmable read only memory cell in a preferred embodiment of the present invention. As shown in FIG. 2, a dielectric layer 222, a floating gate layer 224, an ONO layer 226, a control gate 228 and a hard mask layer 229 are formed and stacked on a substrate 210. In detail, a dielectric layer 222, a floating gate layer 224, an ONO layer (not shown), a control gate layer (not shown) and a hard mask layer (not shown) are sequentially formed to cover the substrate 210, and then the hard mask layer (not shown), the control gate layer (not shown) and the ONO layer (not shown) are patterned.

Figure 3:
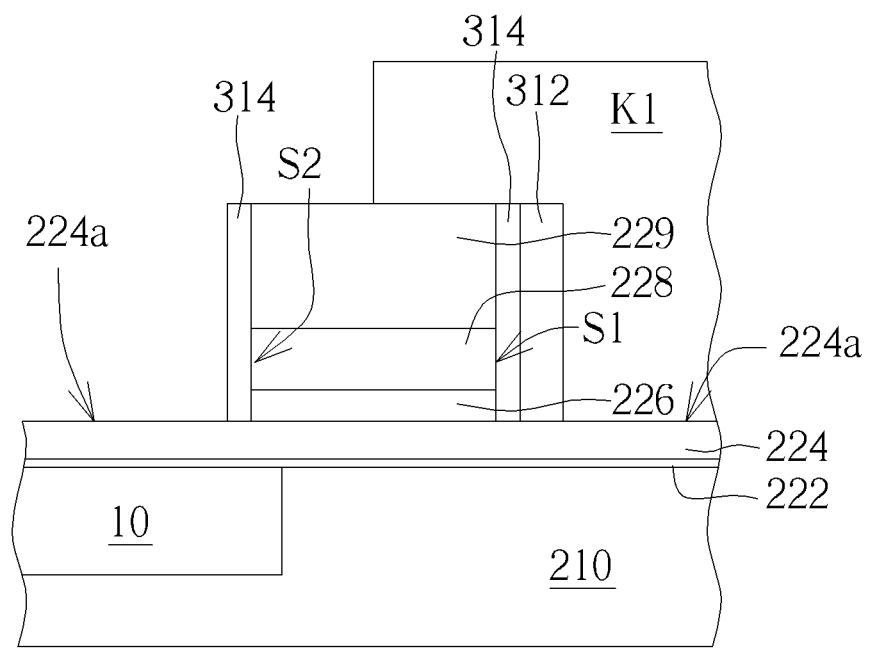
FIG. 3 is a schematic cross-sectional view of a method for forming an electronically erasable programmable read only memory cell in a preferred embodiment of the present invention.

Referring to FIGS. 2-3, a first spacer 312 is formed on the floating gate layer 224 and disposed beside a first sidewall S1 of the control gate 228. As shown in FIG. 2, spacers 314 and first spacers 312 are formed on the floating gate layer 224 and on the first sidewall S1 and the second sidewall S2 of the control gate 228, respectively. Thereafter, a photoresist K1 may be formed and a doping process Q1 may be selectively performed to form a first doped region 10 in the substrate 210 beside the first spacer 312 (and the first spacer 312 is disposed on the second side S2 of the control gate 228). Then, the first spacer 312 on the second side S2 of the control gate 228 is removed, but the first spacer 312 on the first side S1 of the control gate 228 remains, as shown in FIG. 3. Afterwards, the photoresist K1 is removed. The method of forming the first spacer 312 on the floating gate layer 224 and on the first sidewall S1 of the control gate 228 is not limited to this.

Figure 4:
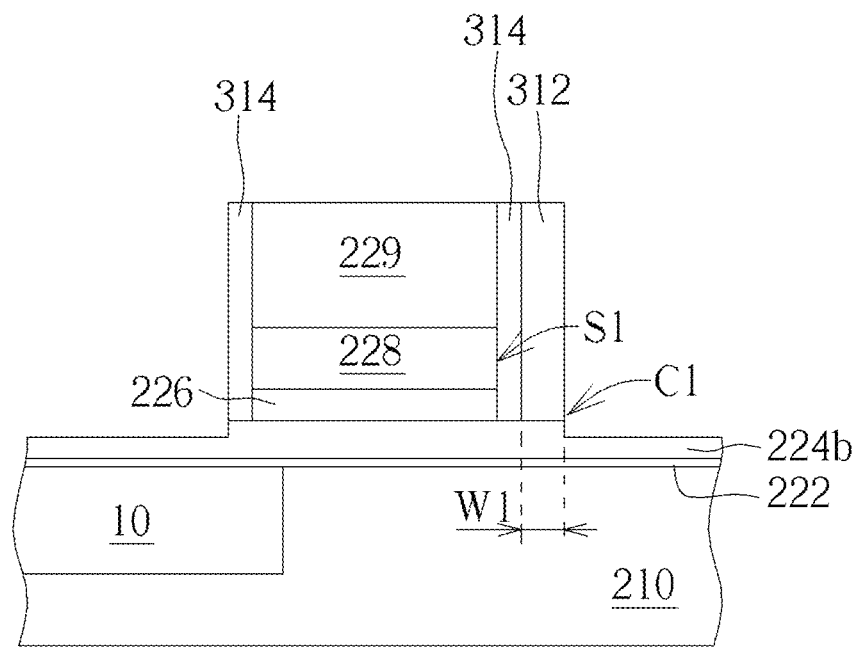
FIG. 4 is a schematic cross-sectional view of a method for forming an electronically erasable programmable read only memory cell in a preferred embodiment of the present invention.

As shown in FIG. 3-4, after removing the photoresist K1, the exposed top portion 224a of the floating gate layer 224 is removed, thereby forming a pre-floating gate layer 224b having a stepped side part C1. It should be noted that only the first spacer 312 has the stepped side part C1 directly under it.

Figure 5:
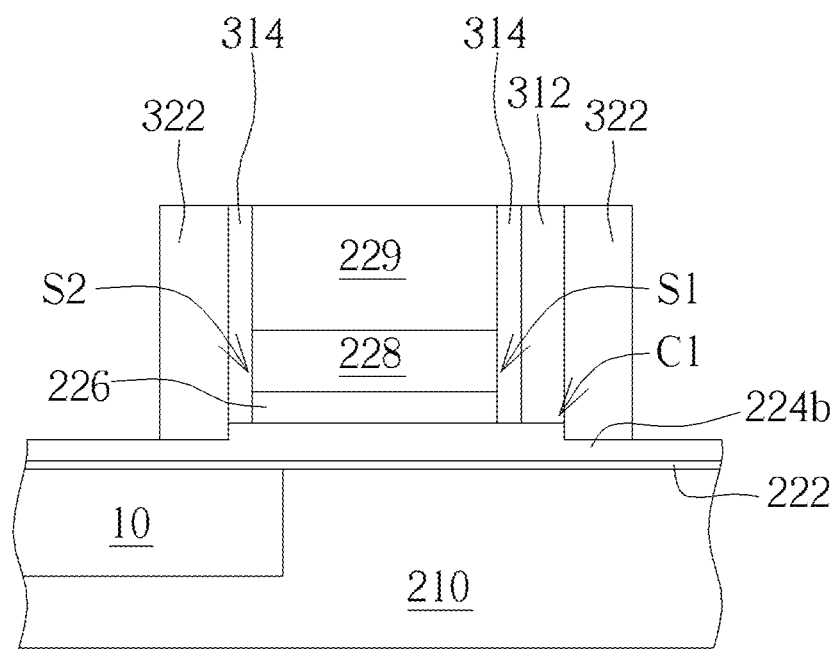
FIG. 5 is a schematic cross-sectional view of a method for forming an electronically erasable programmable read only memory cell in a preferred embodiment of the present invention.
Figure 6:
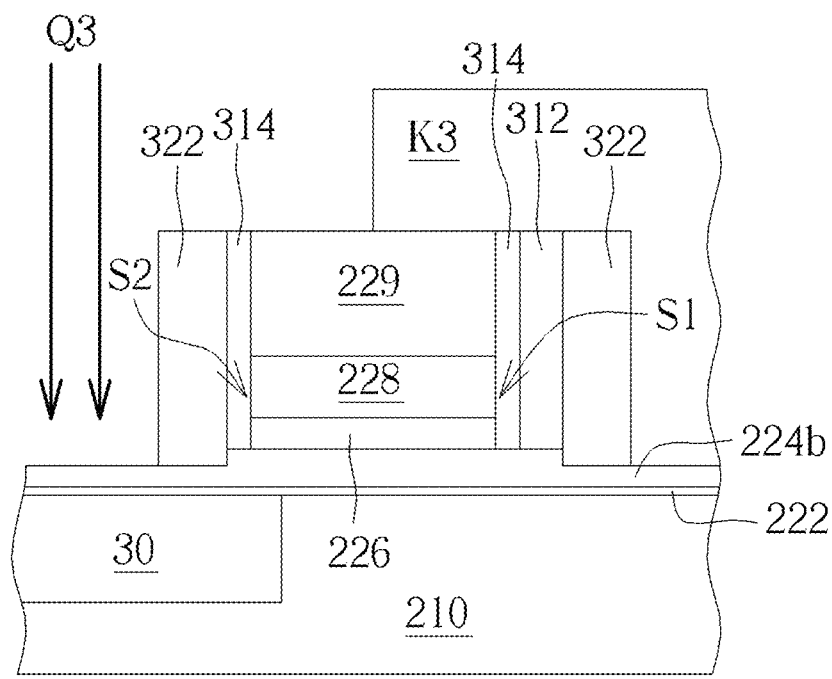
FIG. 6 is a schematic cross-sectional view of a method for forming an electronically erasable programmable read only memory cell in a preferred embodiment of the present invention.
Figure 7:
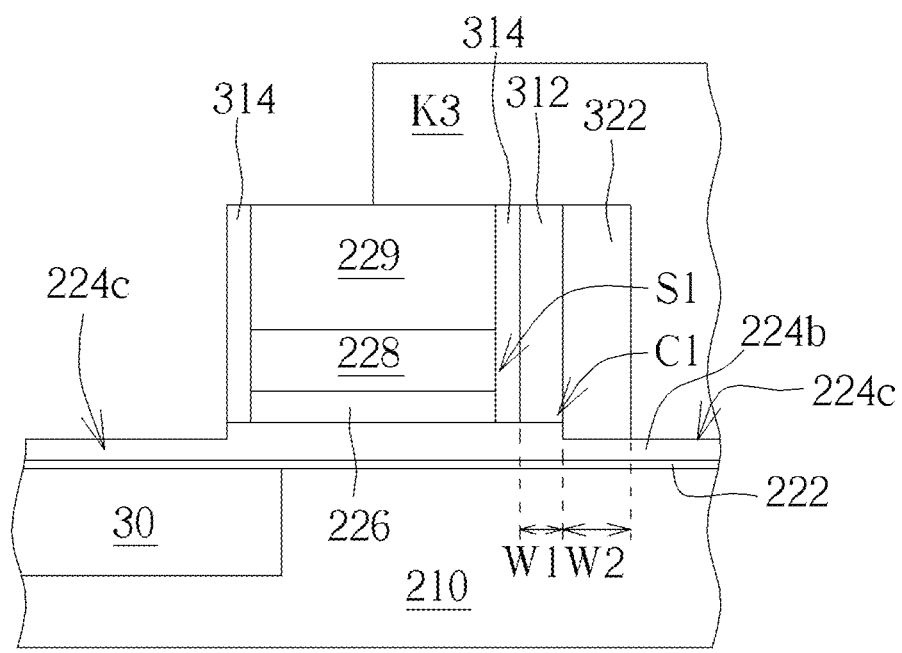
FIG. 7 is a schematic cross-sectional view of a method for forming an electronically erasable programmable read only memory cell in a preferred embodiment of the present invention.

With reference to FIGS. 5-7, a second spacer 322 is formed on the pre-floating gate layer 224b and on the first side S1 of the control gate 228. As shown in FIG. 5, a second spacer 322 is formed on the pre-floating gate layer 224b, on the first sidewall S1 and on the second sidewall S2 of the control gate 228. Since the first spacer 312 has not been removed, the second spacer 322 is located beside the first spacer 312 of the first sidewall S1, and beside the spacer 314 of the second sidewall S2 respectively. Then, as shown in FIG. 6, a photoresist K3 may be formed and a doping process Q3 may be selectively performed to form a second doped region 30 in the substrate 210 beside the second spacer 322 (the second spacer 322 is disposed beside the control gate 228). Then, the second spacer 322 on the second side S2 of the control gate 228 is removed, but the second spacer 322 on the first side S1 of the control gate 228 remains, as shown in FIG. 7. Then, photoresist K3 is removed.

As shown in FIG. 7, after removing the photoresist K3, the exposed portion 224c of the pre-floating gate layer 224b is removed, thereby forming a floating gate 224d, the floating gate 224d has a stepped side part C1 (similar to the two-step side parts P1 and P2 in FIG. 1, the tip of the step has the effect of promoting discharge). In addition, in this embodiment, the width of the first spacer 312 is defined as W1, and the width of the second spacer 322 is defined as W2. the widths W1 and W2 will affect the step width of the floating gate 224d, and the step width can be adjusted according to actual requirements, which is not limited by the present invention. In some embodiment of the present invention, the width W1 of the first spacer is half the width W2 of the second spacer (i.e. W1=W2/2), but the present invention is not limited thereto.

Figure 8:
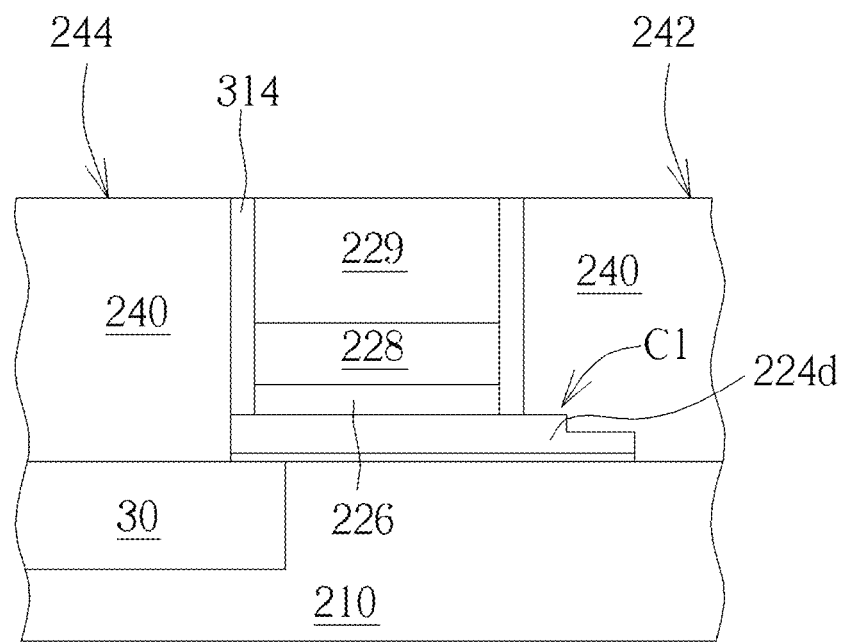
FIG. 8 is a schematic cross-sectional view of a method for forming an electronically erasable programmable read only memory cell in a preferred embodiment of the present invention.

Then, as shown in FIG. 8, after removing the first spacer 312 and the second spacer 322 on the first side S1 of the control gate 228, a blanket dielectric layer (not shown) and a polysilicon layer 240 are sequentially formed on the substrate 210 beside the floating gate 224d, a part 242 of the polysilicon layer 240 on the side of the stepped side C1 serves as an erasing gate. That is, the erasing gate 242 covers the floating gate 224d and contacts the tip of the stepped side C1 of the floating gate 224d. According to the present invention, the floating gate 224d with multiple tips can be formed, so that the electronic erasing ability of the memory cell can be improved by promoting tip discharge.

To sum up, the present invention provides an electronically erasable programmable read only memory cell and a method for forming the same, a first gate and a second gate are arranged on a substrate, the first gate comprises a first floating gate and a first control gate stacked from bottom to top, and the second gate comprises a second floating gate and a second control gate stacked from bottom to top. An erasing gate is arranged between the first gate and the second gate, one side part of the first floating gate directly under the erasing gate and another side part of the second floating gate directly under the erasing gate have multiple tips. In this way, the present invention can promote FN-tunneling by abutting multiple tips of the floating gate to the erasing gate, thereby improving the electronic erase capability of the memory cell.

Preferably, the side part of the first floating gate directly under the erasing gate and the side part of the second floating gate directly under the erasing gate are both two-step side parts, each two-step side part comprises two steps, so as to improve the electronic erasing ability of the memory cell and simplify the manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an electrically erasable programmable read only memory (EEPROM) cell, comprising:
   sequentially forming a floating gate layer and a control gate stacked on a substrate;
   forming a first spacer on the floating gate layer and at a first side of the control gate;
   removing an exposed top of the floating gate layer to form a pre-floating gate layer, wherein the pre-floating gate layer has a stepped side part;
   forming a second spacer on the pre-floating gate layer and on the first side of the control gate; and
   removing the exposed part of the pre-floating gate layer, so as to form a floating gate, wherein the floating gate has a two-step side part.

2. The method for forming an electrically erasable programmable read only memory (EEPROM) cell according to claim 1, wherein the step of sequentially forming the floating gate layer and the control gate stacked on the substrate comprises:
   sequentially forming the floating gate layer, a control gate layer and a hard mask layer to cover the substrate;
   patterning the hard mask layer and the control gate layer to form the control gate and a hard mask.

3. The method for forming an electrically erasable programmable read only memory (EEPROM) cell according to claim 1, wherein the step of forming the first spacer on the floating gate layer and on the first side of the control gate comprises:
   forming the first spacer on the floating gate layer, and on the first side and a second side of the control gate respectively; and
   removing the first spacer on the second side of the control gate, but the first spacer on the first side of the control gate is remained.

4. The method for forming an electrically erasable programmable read only memory (EEPROM) cell according to claim 3, wherein
   before removing the first spacer on the second side of the control gate, further comprising:
   forming a first doped region in the substrate at a side of the first spacer on the second side of the control gate.

5. The method for forming an electrically erasable programmable read only memory (EEPROM) cell according to claim 1, after forming the pre-floating gate layer with the stepped side part, further comprising:
   removing the first spacer on the first side of the control gate.

6. The method for forming an electrically erasable programmable read only memory (EEPROM) cell according to claim 1, wherein the step of forming the second spacer on the pre-floating gate layer and on the first side of the control gate comprises:
   forming the second spacer on the pre-floating gate layer and on the first side and the second side of the control gate respectively; and
   removing the second spacer on the second side of the control gate, but remaining the second spacer on the first side of the control gate.

7. The method for forming an electrically erasable programmable read only memory (EEPROM) cell according to claim 6, before removing the second spacer on the second side of the control gate, further comprising:

forming a second doped region in the substrate on the side of the second spacer on the second side of the control gate.

8. The method for forming an electrically erasable programmable read only memory (EEPROM) cell according to claim 1, wherein a width of the first spacer is half a width of the second spacer.

9. The method for forming an electrically erasable programmable read only memory (EEPROM) cell according to claim 1, after forming the floating gate, further comprising:
   forming a polysilicon layer on the substrate on the side of the floating gate, wherein a part of the polysilicon layer on the side of the two-step side part serves as an erasing gate, and a part of the polysilicon layer opposite to the two-step side part serves as a word line.

* * * * *